(12) United States Patent
Wu et al.

(10) Patent No.: US 10,243,452 B2
(45) Date of Patent: Mar. 26, 2019

(54) ELECTROMAGNETIC SHIELD FOR USE IN A POWER SYSTEM

(71) Applicant: ABB Schweiz AG, Baden (CH)

(72) Inventors: Dong Wu, Ludvika (SE); Jing Ni, Ludvika (SE); Liliana Arevalo, Ludvika (SE); Raul Montano, Ludvika (SE)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 15/524,508

(22) PCT Filed: Nov. 5, 2014

(86) PCT No.: PCT/EP2014/073837
§ 371 (c)(1),
(2) Date: May 4, 2017

(87) PCT Pub. No.: WO2016/070917
PCT Pub. Date: May 12, 2016

(65) Prior Publication Data
US 2018/0054114 A1    Feb. 22, 2018

(51) Int. Cl.
| H05K 9/00 | (2006.01) |
| H02M 1/44 | (2007.01) |
| H05K 7/14 | (2006.01) |
| H02J 3/36 | (2006.01) |

(52) U.S. Cl.
CPC ............ *H02M 1/44* (2013.01); *H05K 7/1432* (2013.01); *H05K 9/0007* (2013.01); *H05K 9/0049* (2013.01); *H02J 3/36* (2013.01); *Y02E 60/60* (2013.01)

(58) Field of Classification Search
CPC ........................... H04B 1/3838; H05K 9/0007
See application file for complete search history.

(56) References Cited

U.S. PATENT DOCUMENTS

| 3,209,213 A | 9/1965 | Pakala et al. |
| 4,080,645 A | 3/1978 | Schilling et al. |

(Continued)

FOREIGN PATENT DOCUMENTS

| CN | 201937544 U | 8/2011 |
| EP | 0495415 A1 | 7/1992 |

(Continued)

OTHER PUBLICATIONS

International Preliminary Report on Patentability Application No. PCT/EP2014/073837 Completed: Feb. 24, 2017 6 pages.

(Continued)

*Primary Examiner* — Hung V Ngo
(74) *Attorney, Agent, or Firm* — Whitmyer IP Group LLC

(57) ABSTRACT

An electromagnetic shield including a base portion and opposing recess walls extending from the base portion at an angle with respect to a plane in which the base portion extends, so as to, together with the base portion, define a recess. At least one recess wall may be arranged such that it has a distal edge with respect to the base portion, wherein the distal edge includes a cylindrical portion. In alternative or in addition, at least one recess wall may be arranged such that at least a portion thereof curves outwards or inwards with respect to the recess.

19 Claims, 3 Drawing Sheets

(56) References Cited

U.S. PATENT DOCUMENTS

| | | | | |
|---|---|---|---|---|
| 8,383,216 B1* | 2/2013 | Hynecek | ............. | B29D 22/003 156/242 |
| 8,954,117 B2* | 2/2015 | Huang | ................ | H04B 1/3883 455/343.6 |
| 2013/0120956 A1* | 5/2013 | Berglund | ............... | H01F 27/04 361/816 |
| 2015/0349828 A1* | 12/2015 | Dyson | ................. | H04B 1/3838 455/575.5 |

FOREIGN PATENT DOCUMENTS

| | | |
|---|---|---|
| EP | 2400512 A1 | 12/2011 |
| JP | H07201607 A | 8/1995 |
| WO | 9427306 A1 | 11/1994 |
| WO | 2007149023 A1 | 12/2007 |
| WO | 2013075754 A1 | 5/2013 |
| WO | 2014019692 A1 | 2/2014 |

OTHER PUBLICATIONS

International Search Report & Written Opinion of the International Searching Authority Application No. PCT/EP2014/073837 Completed: Jun. 29, 2015; dated Jul. 6, 2015 10 pages.

Written Opinion of the International Preliminary Examining Authority Application No. PCT/EP2014/073837 dated Oct. 12, 2016 5 pages.

China Office Action and Translation, Application No. 2014800831713, dated Oct. 11, 2018, 3 pages.

\* cited by examiner

ELECTROMAGNETIC SHIELD FOR USE IN A POWER SYSTEM

TECHNICAL FIELD

The present invention generally relates to the field of power systems such as electrical power distribution or transmission systems, e.g. High Voltage Direct Current (HVDC) power transmission systems. Specifically, the present invention relates to an electromagnetic shield for use in a power system for electromagnetically shielding at least one electrically conductive element included in the power system.

BACKGROUND

Power systems such as electrical power distribution or transmission systems are used to supply, transmit and use electric power. High Voltage Direct Current (HVDC) power transmission is becoming increasingly important due to increasing need for power supply or delivery, interconnected power transmission and distribution systems and long transmission distances from generation stations to load centers.

An HVDC converter station is a type of station configured to convert high voltage direct current (DC) to alternating current (AC) or the reverse. An HVDC converter station may comprise a plurality of elements such as the converter itself (or a plurality of converters connected in series or in parallel), an alternating current switch gear, transformers, capacitors, filters, a direct current switch gear and/or other auxiliary elements. Electronic converters may comprise a plurality of solid-state based devices such as semiconductor devices and may be categorized as line-commutated converters, using e.g. thyristors as switches, or voltage source converters, using transistors such as insulated gate bipolar transistors (IGBTs) as switches (or switching devices). A plurality of solid-state semiconductor devices such as thyristors or IGBTs may be connected together, for instance in series, to form a building block, or cell, of an HVDC converter, which may also be referred to as an HVDC converter valve. According to one example, a plurality of solid-state semiconductor devices such as thyristors or IGBTs may be connected in series in a cell of an HVDC converter. During normal operation of e.g. an HVDC power transmission system or an HVDC grid including the HVDC converter, the solid-state semiconductor devices in the HVDC converter may at times be in a conducting mode in which they are conducting current and at other times be in a blocking mode, in order to attain a desired or required wave form of the current, as known in the art.

Components in a power system such as a HVDC power system operating at relatively high DC voltages may be electromagnetically shielded in order to reduce or eliminate the risk of partial discharges, arcing or flashovers occurring between the component and for example a wall, floor or ceiling within a building in which the component is arranged. For example, an HVDC converter is often arranged in a purpose-built building, which may be referred to as a valve hall or converter hall, for accommodating the HVDC converter. The required air clearance between the component and for example a wall, floor or ceiling within a building in which the component is arranged may at least in part depend on the electromagnetic shielding capacity or capabilities of the electromagnetic shield and/or the required or intended operating voltage of the power system.

SUMMARY

In designing a converter hall, several considerations may have to be taken into account. For example, the air clearance between a converter and the walls, floor and ceiling of the converter hall should conform to security requirements, and should in general be a few meters or more. The dimensions of the converter hall may depend at least in part on the required or intended operating voltage of the electrical power distribution or transmission system. In general, the higher the operating voltage or rated voltage, the larger the air clearance that is required. The dimensions of the converter hall may among other things also depend on presence of any buildings adjacent the converter hall. At the same time, there is however also a desire for the converter hall to be as small as possible. This is for example due to that available space often is scarce and/or expensive, and the size of the converter hall may directly affect the costs for constructing and configuring the converter hall.

The rated voltage requirement for DC transmission systems has increased recently and is expected to continue to increase. In some applications, the rated voltage requirement for DC transmission systems is about 1100 kV or even more. Such increased rated voltage requirements may entail increased electromagnetic field stresses on electromagnetic shields used for electromagnetically shielding components in the power system. Electromagnetic shields according to the current designs or constructions are in general close to the saturation zone for such voltage levels, and may not be able to withstand electric fields caused by DC voltages of about 1100 kV or more, at least not while at the same time being able to keep the required air clearances relatively small.

In view of the above, a concern of the present invention is to achieve an electromagnetic shield capable of withstanding electric fields caused by DC voltages of about 1100 kV or more.

A further concern of the present invention is to achieve an electromagnetic shield which facilitates or enables reducing the required air clearance between an energized component in a power system and objects in the surroundings of the component, such as a wall, floor or ceiling within a building in which the component is arranged.

A further concern of the present invention is to achieve an electromagnetic shield capable of withstanding electric fields caused by DC voltages of about 1100 kV or more, while at the same time facilitating or enabling reducing the required air clearance between an energized component in a power system and objects in the surroundings of the component, such as a wall, floor or ceiling within a building in which the component is arranged.

A further concern of the present invention is to facilitate or enable reducing a size or dimension of a building in which an energized component included in a power system is arranged.

To address at least one of these concerns and other concerns, electromagnetic shields in accordance with the independent claims are provided. Preferred embodiments are defined by the dependent claims.

According to a first aspect, there is provided an electromagnetic shield for use in a power system, for electromagnetically shielding at least one electrically conductive element included in the power system, which at least one electrically conductive element when energized generates an electric field around the at least one electrically conductive element. The electromagnetic shield comprises a base portion and opposing recess walls extending from the base portion at an angle with respect to a plane in which the base portion extends, so as to, together with the base portion, define a recess. At least one recess wall is arranged such that it has a distal edge with respect to the base portion, wherein the distal edge comprises a cylindrical portion.

In the context of the present application, by a cylindrical portion (of the distal edge) it is meant a portion or structure that is cylinder-like, i.e. having a shape or form at least in part resembling the shape or form of a cylinder, and not necessarily shaped as a perfect or ideal cylinder. The cylindrical portion may be solid or hollow, or it may be in part solid or in part hollow.

According to a second aspect, there is provided an electromagnetic shield for use in a power system, for electromagnetically shielding at least one electrically conductive element included in the power system, which at least one electrically conductive element when energized generates an electric field around the at least one electrically conductive element. The electromagnetic shield comprises a base portion and opposing recess walls extending from the base portion at an angle with respect to a plane in which the base portion extends, so as to, together with the base portion, define a recess. At least one recess wall is arranged such that at least a portion thereof curves outwards or inwards with respect to the recess.

According to a third aspect, there is provided an electromagnetic shield for use in a power system, for electromagnetically shielding at least one electrically conductive element included in the power system, which at least one electrically conductive element when energized generates an electric field around the at least one electrically conductive element. The electromagnetic shield comprises a base portion and opposing recess walls extending from the base portion at an angle with respect to a plane in which the base portion extends, so as to, together with the base portion, define a recess. The recess walls are arranged such that they include corners which curve outwards or inwards with respect to the recess.

The first, second and third aspects and embodiments of the present invention are based on a realization that certain geometrical features formed or arranged in an electromagnetic shield in combination or on their own can help reducing an electric field over portions of or even the whole electromagnetic shield when it is arranged so as electromagnetically shield at least one electrically conductive element, which at least one electrically conductive element when energized generates an electric field around the at least one element.

The geometrical features include:
- at least one recess wall being arranged such that it has a distal edge with respect to the base portion, wherein the distal edge comprises a cylindrical portion;
- at least one recess wall being arranged such that at least a portion thereof curves outwards or inwards with respect to the recess; and/or
- the recess walls being arranged such that they include corners which curve outwards or inwards with respect to the recess.

In other words, an electromagnetic shield e.g. in accordance with any one of the first, second and third aspects or including or exhibiting one or more of the above-mentioned geometrical features may facilitate or enable the electromagnetic shield to withstand relatively high electric fields over portion(s) of the electromagnetic shield or substantially over the whole electromagnetic shield.

A construction of an electromagnetic shield e.g. in accordance with any one of the first, second and third aspects or including or exhibiting one or more of the above-mentioned geometrical features has been found to allow the electromagnetic shield to cope with very high voltage requirements, up to DC voltages of 1100 kV or more. The electromagnetic shield e.g. in accordance with any one of the first, second and third aspects or including or exhibiting one or more of the above-mentioned geometrical features can however be used in applications having lower voltage requirements, e.g. DC voltages between about 500 kV and 900 kV, such as DC voltages between about 600 kV and 800 kV.

The extent or degree of reduction of an electric field over portions of or even the whole electromagnetic shield when it is arranged so as electromagnetically shield at least one electrically conductive element, which at least one electrically conductive element when energized generates an electric field around the at least one element, may be higher the more of the above-mentioned geometrical features the electromagnetic shield exhibits. For example, the electromagnetic shield may according to an embodiment of the present invention exhibit all of the three above-mentioned geometrical features.

An electromagnetic shield exhibiting one or more of the three above-mentioned geometrical features has been found advantageous or suitable for example in HVDC applications, possibly with a required or desired rated DC voltage of about 1100 kV or even more, although the electromagnetic shield is expected to advantageous or suitable in HVDC applications also at DC lower voltages.

One or more of the three above-mentioned geometrical features may facilitate or enable reducing electrical field stress at least on portion(s) of the electromagnetic shield, which in turn may improve the capacity or capability of the electromagnetic shield to withstand electric fields caused by DC voltages of about 1100 kV or more, and possibly at the same time reduce the required air clearance between an energized component in a power system and objects in the surroundings of the component, such as a wall, floor or ceiling within a building in which the component is arranged.

The estimated reduction in the required air clearance is about 20% or even more. By reducing the required air clearance, the size and/or dimensions of a building in which the component is arranged can be reduced, thereby allowing for reducing costs for constructing and configuring the building.

The beneficial effects of an electromagnetic shield exhibiting one or more of the three above-mentioned geometrical features have been verified by finite-element method simulations, e.g. using COMSOL Multiphysics, produced by Comsol AB based in Stockholm, Sweden, and can be verified also by means of any other finite-element method simulation technique capable of solving static and dynamic electromagnetic field equations. The beneficial effects of an electromagnetic shield exhibiting one or more of the three above-mentioned geometrical features have further been verified by experiments carried out on prototypes.

An electromagnetic shield e.g. in accordance with any one of the first, second and third aspects or including or exhibiting one or more of the above-mentioned geometrical features can be made of a material for example including a metallic material, e.g. including one or more metals or metal alloys, or (stainless) steel. However, the electromagnetic shield may in principle be made of a material which in principle may include any material that has a sufficiently high electrical conductivity. The electromagnetic shield may be manufactured for example using any metallurgical process as known in the art.

According to a fourth aspect, there is provided a power converter assembly, comprising at least one electromagnetic shield according to any one of the first, second or third aspect, for electromagnetically shielding at least one electrically conductive element of the power converter assembly, which at least one electrically conductive element when energized generates an electric field around the at least one electrically conductive element. The power converter assembly may for example be constituted by or be included in a HVDC converter station.

According to a fifth aspect, there is provided a power system comprising at least one electrically conductive element which when energized generates an electric field around the at least one electrically conductive element. The power system comprises an electromagnetic shield according to any one of the first, second or third aspect, for electromagnetically shielding the at least one electrically conductive element.

The electrically conductive element referred to in the foregoing with respect to the first to fifth aspects may in principle include or be constituted by any energized element, energized for example by means of direct current.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the present invention will be described below with reference to the accompanying drawings.

Figure 1:
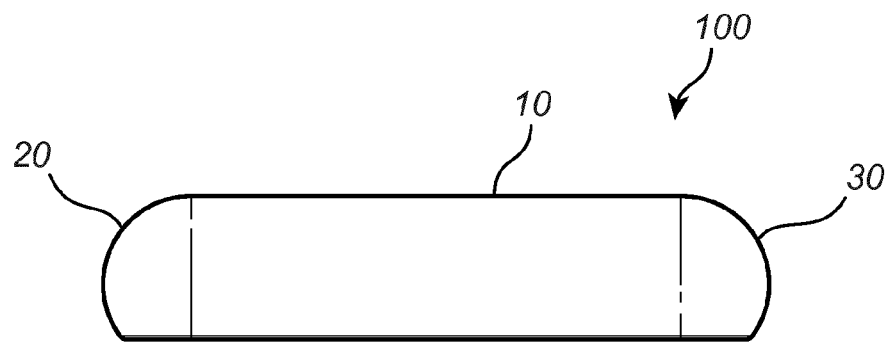
FIGS. 1 and 2 are schematic side views of an electromagnetic shield according to an embodiment of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the present invention to those skilled in the art.

In the figures, identical reference numerals denote the same or similar components having a same or similar function, unless specifically stated otherwise.

Figure 2:
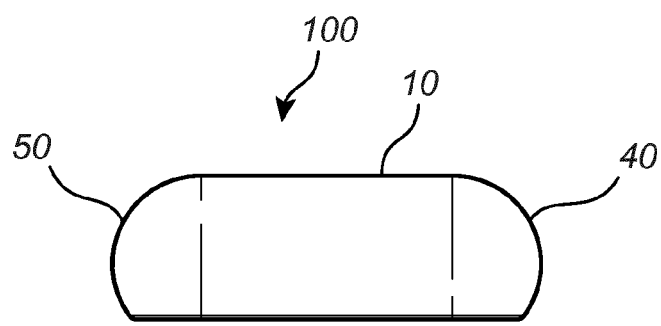

FIGS. 1 and 2 are schematic side views of an electromagnetic shield 100 according to an embodiment of the present invention. FIGS. 1 and 2 illustrate the electromagnetic shield 100 from two different directions perpendicular to each other.

Figure 3:
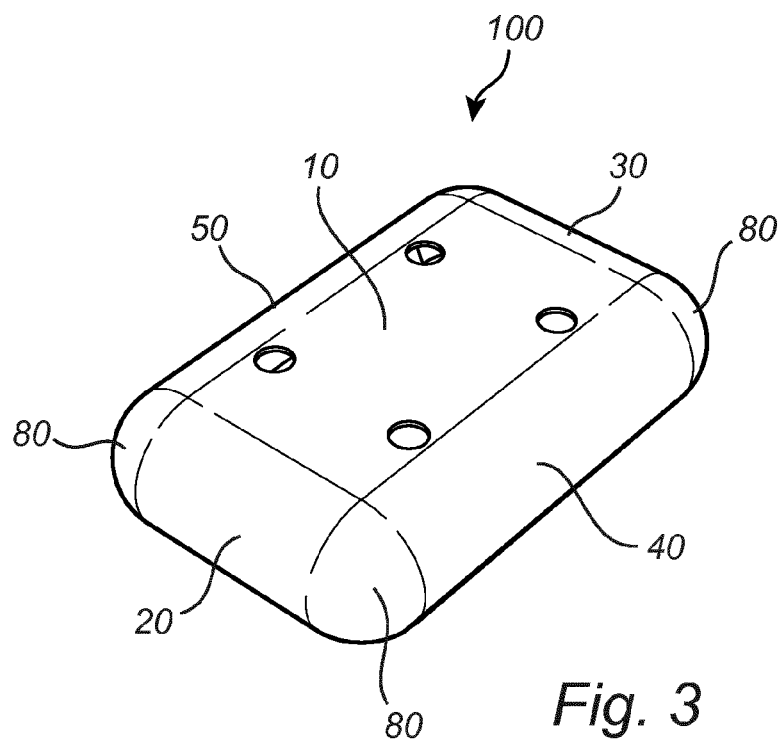
FIG. 3 is a schematic perspective view of an electromagnetic shield according to an embodiment of the present invention.

FIG. 3 is a schematic perspective view of an electromagnetic shield 100 according to an embodiment of the present invention.

With reference to FIGS. 1-3, the electromagnetic shield 100 is for use in a power system for electromagnetically shielding at least one electrically conductive element (not shown in FIGS. 1 and 2) included in the power system, which at least one electrically conductive element when energized generates an electric field around the at least one electrically conductive element.

The electromagnetic shield 100 comprises a base portion 10, which in accordance with the embodiment illustrated in FIGS. 1 and 2 may be substantially flat or planar on an outer surface, which is shown in FIGS. 1 and 2. As will be further explained with reference to the other figures, an inner surface of the base portion 10 may in alternative or in addition be substantially flat or planar. The inner surface is not shown in FIGS. 1 and 2.

The electromagnetic shield 100 comprises opposing recess walls 20, 30, 40, 50 which extend from the base portion 10, as illustrated in FIGS. 1-3, at an angle with respect to a plane in which the base portion 10 extends. The recess walls 20, 30, 40, 50 extend from the base portion 10 at an angle with respect to a plane in which the base portion 10 extends so as to, together with the base portion 10, define a recess, or depression.

In accordance with the embodiments illustrated in FIGS. 1 to 3, and as perhaps best seen in FIG. 3, the recess walls 20, 30, 40, 50 may be arranged such that they include corners 80, which corners 80 may have a curved shape and possibly curve outwards (or inwards) with respect to the recess, as illustrated e.g. in FIG. 3. According to examples, such corners 80 may have different configurations or shapes, such as a rounded shape, a semioval shape, or a semispherical shape.

At least one recess wall 20, 30, 40, 50 may be arranged such that at least a portion thereof curves outwards (such as illustrated in FIGS. 1 to 3) or inwards (not shown in the figures) with respect to the recess.

Any recess wall 20, 30, 40, 50 which is arranged such that at least a portion thereof curves outwards or inwards with respect to the recess, may have a cross section in a direction perpendicular to a transverse direction of the at least one recess wall 20, 30, 40, 50 which for example may have a rounded shape, a shape of a section of an oval, or a shape of a section of a circle, which may be larger than about quarter of a circle.

As perhaps best illustrated in FIG. 3, any recess wall 20, 30, 40, 50, which is arranged such that at least a portion thereof curves outwards or inwards with respect to the recess, may define an elongated side wall of the recess.

Another way to describe the electromagnetic shield 100 is according to an embodiment of the present invention as having trough-like configuration or geometry, with the bottom of the 'trough' formed or constituted by the base portion 10 and the side walls of the 'through' formed or constituted by the opposing recess walls 20, 30, 40, 50.

Figure 4:
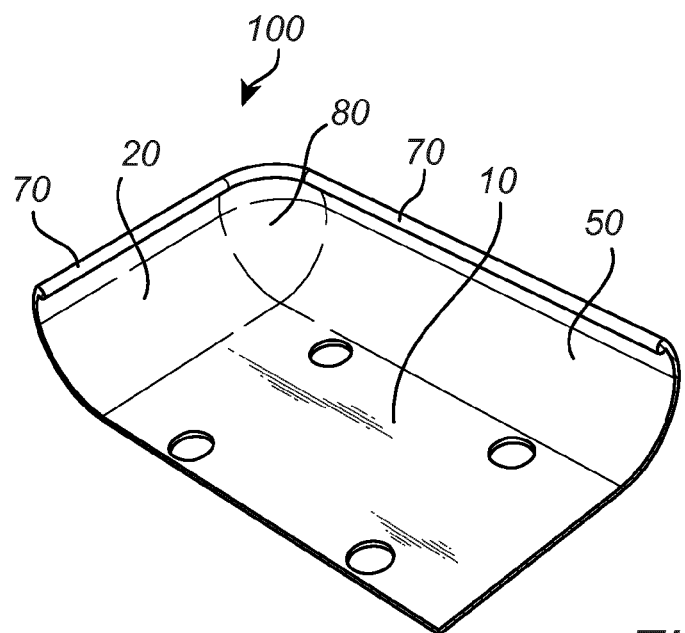
FIG. 4 is a schematic perspective view of a portion of an electromagnetic shield according to an embodiment of the present invention.

Such a trough-like configuration or geometry is perhaps best illustrated in FIG. 4, which a schematic perspective view of a portion of an electromagnetic shield 100 according to an embodiment of the present invention.

Figure 5:
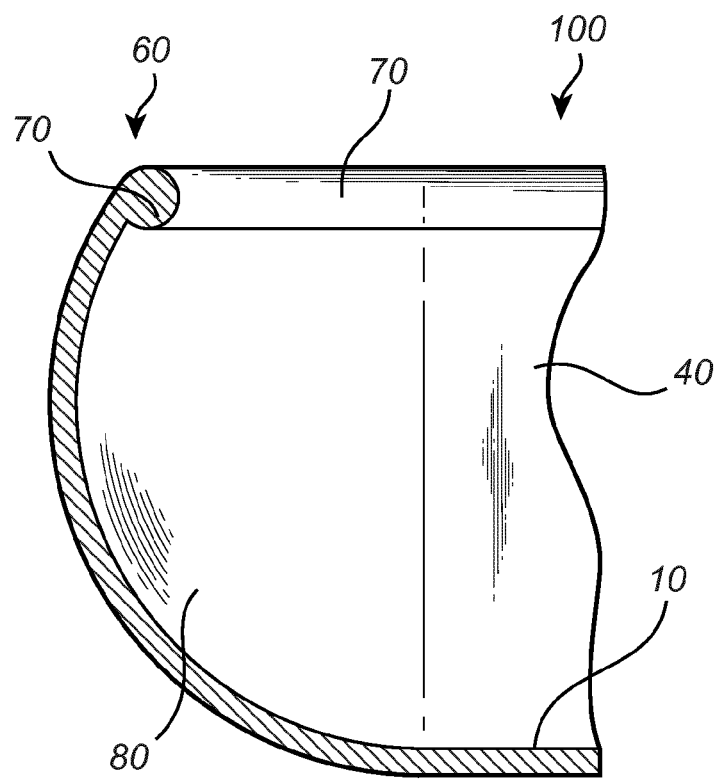
FIG. 5 is a transversal cross sectional view of a portion of an electromagnetic shield according to an embodiment of the present invention.

Furthermore, FIG. 5 is a transversal cross sectional view of a portion of an electromagnetic shield 100 according to an embodiment of the present invention.

According to the embodiments illustrated in FIGS. 4 and 5, the recess walls 20, 40, 50 are arranged such that each of them has a distal edge 60 (not indicated in FIG. 4) with respect to the base portion 10, wherein the distal edge 60 comprises a cylindrical portion 70.

Even though in accordance with the embodiments illustrated in FIGS. 4 and 5 the recess walls 20, 40, 50 are arranged such that each of them has a distal edge 60 comprising a cylindrical portion 70, only one or two of them (or none of them) may be arranged with a distal edge 60 comprising a cylindrical portion 70. The cylindrical portion 70 may extend along substantially the entire length of the distal edge 60.

In accordance with the embodiments illustrated in FIGS. 4 and 5, the cylindrical portion 70 may define a distal end of the recess wall 20, 40, 50 with respect to the base portion 10. Another way to describe the cylindrical portion 70 in accordance with the embodiments illustrated in FIGS. 4 and 5 is that the cylindrical portion 70 may constitute an end of the recess wall 20, 40, 50, or the distal edge 60.

In accordance with the embodiment illustrated in FIG. 5, the cylindrical portion 70 may have a substantially circular cross section in a direction parallel with an axial extension. However, it is to be understood that the shape of the cylindrical portions 70 illustrated in FIGS. 4 and 5 are merely according to examples and variations are possible. As indicated in the foregoing, the cylindrical portions 70 should in general be understood as portions or structures that are tube-like or cylinder-like, i.e. having a shape or form at least in part resembling the shape or form of a cylinder. Thus, the cylindrical portions 70 do not necessarily have to be shaped as perfect or ideal cylinders. Each of the cylindrical portions 70 may be solid or hollow, or it may be in part solid or in part hollow.

Further in accordance with the embodiments illustrated in FIG. 5, the recess wall 20, 40 and/or 50 and the corresponding cylindrical portion 70 may be integrally arranged with respect to each other.

Similarly to the electromagnetic shields 100 illustrated in FIGS. 1 to 3, the electromagnetic shields 100 illustrated in FIGS. 4 and 5 include corners 80. According to the embodiments illustrated in FIGS. 4 and 5, the recess walls 20, 40, 50 may be arranged such that they include corners 80, which corners 80 may have a curved shape and possibly curve outwards (or inwards) with respect to the recess, as illustrated e.g. in FIG. 4. According to examples, such corners 80 may have different configurations or shapes, such as a rounded shape, a semioval shape, or a semispherical shape.

Figure 6:
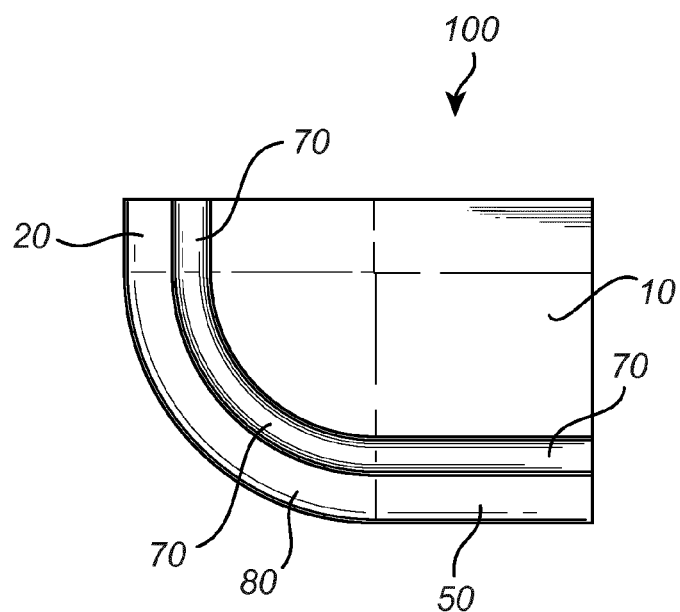
FIG. 6 is a view from above of a portion of an electromagnetic shield according to an embodiment of the present invention.

FIG. 6 is a view from above of a portion of an electromagnetic shield 100 according to an embodiment of the present invention.

In accordance with the embodiments illustrated in FIGS. 1-6, one or more of the recess walls 20, 30, 40, 50 may be integrally arranged with respect to each other, e.g. so as to form or define a single, continuous recess wall portion, or with the recess walls 'blending in' with each other. Hence, in the context of the present application, the term "recess wall" may refer for example to a portion of a single, continuous recess wall, or a wall part being substantially separate from other wall part(s).

In addition or in alternative, and in accordance with the embodiments illustrated in FIGS. 1-6, the base portion 10 and at least one of the recess walls 20, 30, 40, 50 may be integrally arranged with respect to each other, e.g. so as to form or define a single, continuous shield portion.

Figure 7:
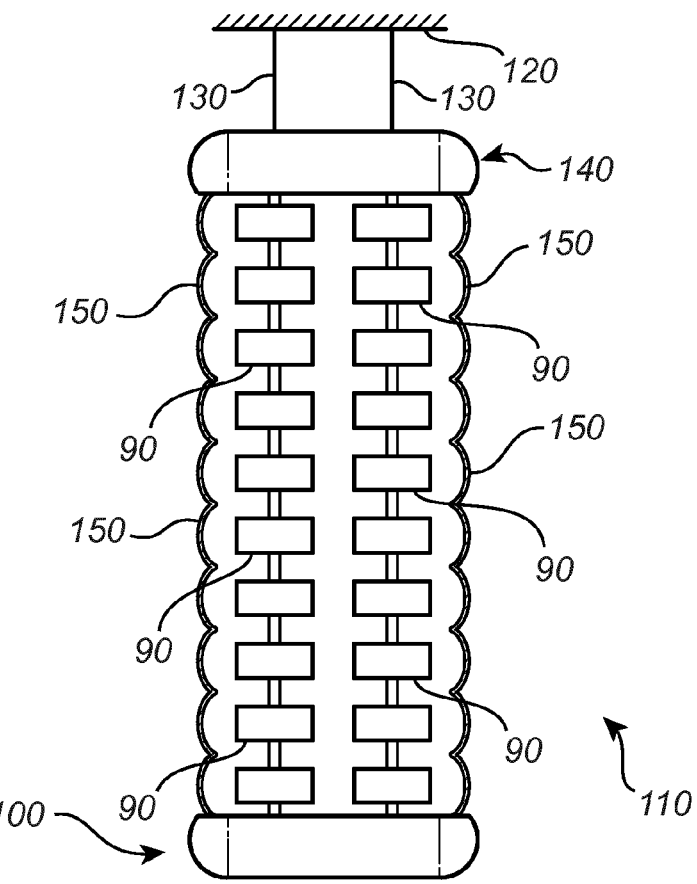
FIG. 7 is a schematic sectional side view of a power converter assembly comprising an electromagnetic shield according to an embodiment of the present invention.

FIG. 7 is a schematic sectional side view of a power converter assembly 110 comprising an electromagnetic shield 100 according to an embodiment of the present invention.

According to the embodiment illustrated in FIG. 7, the power converter assembly 110 is an HVDC converter which comprises a plurality of cells 90, or valves, arranged in two stacks, each stack including several cells 90, suspended from a ceiling 120 of a building (not shown in FIG. 7) in which the power converter assembly 110 is arranged or located by means of coupling or connection means 130 e.g. in the form of rods 130 or the like which extend through central holes in the cells 90. The cells 90 are electrically connected to each other so as to form an AC/DC power converter. Each of the cells 90 generates an electric field around the cell 90 when energized. The power converter assembly 110 comprises a top electromagnetic shield 140 and bottom electromagnetic shield 100 according to embodiments of the present invention arranged at the top and bottom of the stacks of cells 90. As used herein, the terms "top" and "bottom" refer to a longitudinal direction of the stacks. Each of the top electromagnetic shield 140 and the bottom electromagnetic shield 100 may be constructed and/or configured similarly to or the same as any one of the electromagnetic shields 100 described in the foregoing with reference to any one of FIGS. 1-6.

With further reference to FIG. 3, the top electromagnetic shield 140 may be provided with through-holes, e.g. arranged in the base portion 10, for allowing passage of coupling or connection means 130 e.g. in the form of rods 130 therethrough and for effecting coupling or connection of the top electromagnetic shield 140 to the stack(s) of cells 90. In general, the bottom electromagnetic shield 100 is not provided with such through-holes. The coupling or connection means 130 or rods 130 may be electrically insulating.

In use of a power converter assembly 110 with a stacks of cells 90 such as illustrated in FIG. 7, the top electromagnetic shield 140 may be exposed to lower voltage than the bottom electromagnetic shield 100. As illustrated in FIG. 7, the power converter assembly 110 may comprise electromagnetic shields 150 arranged around the cells 90. Around each cell 90 there may be arranged an electromagnetic shield 150. Although not explicitly illustrated in FIG. 7, there may be a separation between electromagnetic shields 150, and also between the top electromagnetic shield 140 and the electromagnetic shields 150 adjacent to the top electromagnetic shield 140, and between the bottom electromagnetic shield 100 and the electromagnetic shields 150 adjacent to the bottom electromagnetic shield 100.

It is to be understood that only some of the cells 90, and some of the electromagnetic shields 150 arranged around the cells 90, are indicated by reference numerals in FIG. 7. In alternative or in addition, the power converter assembly 110 may comprise cells not arranged in stacks. The power converter assembly 110 may include one stack or more than two stacks. Further, it is to be understood that various components that may be included in the power converter assembly 110, such as a busbar (e.g., a busbar between the stacks), a corona shield, and/or any other conductors which electrically interconnect components of the power converter assembly 110, etc. Such components are not shown in FIG. 7.

In conclusion, there is disclosed an electromagnetic shield. The electromagnetic shield comprises a base portion and opposing recess walls extending from the base portion at an angle with respect to a plane in which the base portion extends, so as to, together with the base portion, define a recess. At least one recess wall may be arranged such that it has a distal edge with respect to the base portion, wherein the distal edge comprises a cylindrical portion. In alternative or in addition, at least one recess wall may be arranged such that at least a portion thereof curves outwards or inwards with respect to the recess.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An electromagnetic shield for use in a power distribution or transmission system for electromagnetically shielding at least one electrically conductive element included in the power distribution or transmission system, the at least one electrically conductive element when energized generates an electric field around the at least one electrically conductive element, the electromagnetic shield comprising:
   a base portion; and
   opposing recess walls extending from the base portion at an angle with respect to a plane in which the base portion extends, so as to, together with the base portion, define a recess having a shape of a depression in the electromagnetic shield;
   the base portion and the opposing recess walls providing electromagnetic shielding that is configured to withstand an electric field generated by DC voltages of at least 500 kV around the at least one electrically conductive element of the power distribution or transmission system;
   wherein at least one recess wall of the opposing recess walls is arranged to have a distal edge with respect to the base portion, wherein the distal edge comprises a cylindrical portion.

2. The electromagnetic shield according to claim 1, wherein the cylindrical portion defines a distal end of the at least one recess wall with respect to the base portion.

3. The electromagnetic shield according to claim 2, wherein the cylindrical portion extends along substantially the entire length of the distal edge.

4. The electromagnetic shield according to claim 1, wherein the cylindrical portion extends along substantially the entire length of the distal edge.

5. The electromagnetic shield according to claim 1, wherein the cylindrical portion constitutes an end of the at least one recess wall or the distal edge.

6. The electromagnetic shield according to claim 1, wherein the cylindrical portion has a substantially circular cross section in a direction parallel with an axial extension.

7. The electromagnetic shield according to claim 1, wherein the at least one recess wall and the cylindrical portion are integrally arranged with respect to each other.

8. The electromagnetic shield according to claim 1, wherein at least one recess wall of the opposing recess walls is arranged such that at least a portion thereof curves outwards or inwards with respect to the recess.

9. The electromagnetic shield according to claim 8, wherein the at least one recess wall, which includes the at least a portion that curves, has a cross section in a direction perpendicular to a transverse direction of the at least one recess wall which has a rounded shape, a shape of a section of an oval, or a shape of a section of a circle.

10. The electromagnetic shield according to claim 9, wherein the section of a circle is larger than a quarter of a circle.

11. The electromagnetic shield according to claim 8, wherein the at least one recess wall which includes the at least a portion that curves, defines an elongated side wall of the recess.

12. The electromagnetic shield according to claim 1, wherein the recess walls are arranged to include corners which curve outwards or inwards with respect to the recess.

13. The electromagnetic shield according to claim 12, wherein the corners have a rounded, semioval or a semispherical shape.

14. The electromagnetic shield according to claim 1, wherein the recess walls are integrally arranged with respect to each other.

15. The electromagnetic shield according to claim 1, wherein the base portion and the recess walls are integrally arranged with respect to each other.

16. The electromagnetic shield according to claim 1, wherein the base portion is substantially planar.

17. The electromagnetic shield according to claim 1, wherein the base portion and the opposing recess walls are configured to provide electromagnetic shielding in a high voltage direct current (HVDC) application.

18. A power converter assembly that converts high voltage direct current to alternating current or alternating current to high voltage direct current, the power converter assembly comprising:
   at least one electromagnetic shield electromagnetically shielding at least one electrically conductive element of the power converter assembly, the electromagnetic shield including:
   a base portion; and
   opposing recess walls extending from the base portion at an angle with respect to a plane in which the base portion extends, so as to, together with the base portion, define a recess having a shape of a depression in the electromagnetic shield,
   wherein at least one recess wall of the opposing recess walls being arranged to have a distal edge with respect to the base portion, wherein the distal edge comprises a cylindrical portion;
   wherein the base portion and the opposing recess walls provide electromagnetic shielding that is configured to withstand an electric field generated by DC voltages of at least 500 kV around the at least one electrically conductive element.

19. A power distribution or transmission system comprising:
   at least one electrically conductive element; and an electromagnetic shield electromagnetically shielding the at least one electrically conductive element, the electromagnetic shield including:

a base portion; and opposing recess walls extending from the base portion at an angle with respect to a plane in which the base portion extends, so as to, together with the base portion, define a recess having a shape of a depression in the electromagnetic shield, at least one recess wall of the opposing recess walls being arranged to have a distal edge with respect to the base portion, wherein the distal edge comprises a cylindrical portion;

wherein the base portion and the opposing recess walls provide electromagnetic shielding that is configured to withstand an electric field generated by DC voltages of at least 500 kV around the at least one electrically conductive element of the power distribution or transmission system.

* * * * *